(12) United States Patent
Chen et al.

(10) Patent No.: US 10,938,191 B2
(45) Date of Patent: Mar. 2, 2021

(54) HEAT DISSIPATION STRUCTURES FOR POWER DISTRIBUTION UNITS

(71) Applicant: EATON INTELLIGENT POWER LIMITED, Dublin (IE)

(72) Inventors: George Chen, Taipei (TW); Josiah D. Smith, Mission Viejo, CA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 57 days.

(21) Appl. No.: 16/176,249

(22) Filed: Oct. 31, 2018

(65) Prior Publication Data

US 2020/0136355 A1 Apr. 30, 2020

(51) Int. Cl.
*H02B 1/56* (2006.01)
*H01R 25/00* (2006.01)
*H02B 1/04* (2006.01)

(52) U.S. Cl.
CPC ............. *H02B 1/56* (2013.01); *H01R 25/006* (2013.01); *H02B 1/04* (2013.01)

(58) Field of Classification Search
CPC .......... H02B 1/56; H02B 1/04; H01R 25/006; H05K 1/0203; H05K 7/20; H05K 7/20154; H05K 1/0201; H05K 3/0061
USPC .................................................. 439/487, 485
See application file for complete search history.

(56) References Cited

U.S. PATENT DOCUMENTS

| | | | | |
|---|---|---|---|---|
| 10,292,310 B2 * | 5/2019 | Maloney | ................... | H02B 1/56 |
| 10,524,377 B2 * | 12/2019 | Smith | ................... | H01R 25/162 |
| 10,553,382 B2 | 2/2020 | Lagree et al. | | |
| 2011/0143580 A1 | 6/2011 | Lee | | |
| 2013/0196535 A1 | 8/2013 | Utz | | |
| 2014/0349514 A1 * | 11/2014 | Yang | ................... | H01R 13/6581 439/487 |
| 2017/0363371 A1 * | 12/2017 | David | ...................... | F28F 5/00 |
| 2019/0189378 A1 | 6/2019 | Lagree et al. | | |
| 2019/0235024 A1 | 8/2019 | Smith et al. | | |
| 2019/0239379 A1 | 8/2019 | Smith et al. | | |

FOREIGN PATENT DOCUMENTS

EP 3379655 9/2018

OTHER PUBLICATIONS

International Search Report and Written Opinion; Corresponding PCT Application No. PCT/EP2019/025366 filed Oct. 24, 2019; Authorized Officer Nathalie Mailliard; dated Jan. 30, 2020.

* cited by examiner

*Primary Examiner* — Travis S Chambers
(74) *Attorney, Agent, or Firm* — Squire Patton Boggs US LLP

(57) ABSTRACT

An outlet assembly includes an outlet having a pin extending from a bottom side of the outlet. Optionally, the pin extends from a shroud protruding from the bottom side of the outlet. The outlet assembly includes a heat dissipating structure having a wall with an inner surface facing an outer surface of the pin or an outer surface of the shroud. The outlet assembly includes a thermal pad positioned between the pin and the wall or the shroud and the wall. The heat dissipating structure applies a force to the thermal pad that presses the thermal toward the pin or the shroud. A PDU having an input module and an outlet module including the outlet assembly is also provided.

20 Claims, 13 Drawing Sheets

HEAT DISSIPATION STRUCTURES FOR POWER DISTRIBUTION UNITS

FIELD OF INVENTION

The present disclosure relates to heat dissipation structures. More specifically, the present disclosure relates to heat dissipation structures for power distribution units.

BACKGROUND

Power distribution units ("PDUs") distribute electric power to devices that are electrically connected to the PDU. The PDU includes a connection to a three-phase busway, and a plurality of components to provide, regulate, and monitor the current being distributed to the devices. Some examples of the components used in such a PDU include input modules, outlet modules, circuit breakers, and sensors. As electrical current passes through the PDU, one or more features of the PDU can increase in temperature. Exposure to increased temperatures can degrade or destroy some components within the PDU and can cause the PDU to be unsafe or ineffective for its intended purpose. Accordingly, for safe and effective distribution of electric power, structures for dissipating heat within a PDU are needed.

SUMMARY

In one embodiment, a PDU includes an input module. The PDU includes an electrical connector configured to be connected to an outlet of a power source to provide power to the input module. The PDU includes an outlet module, and the input module is configured to distribute the power from the electrical connector to the outlet module. The outlet module includes an outlet assembly including an outlet having a shroud protruding from a bottom side of the outlet and a pin extending from the shroud. The outlet assembly includes a heat dissipating structure having a wall with an inner surface facing an outer surface of the shroud. The outlet assembly includes a thermal pad positioned between the shroud and the wall, with a first side surface of the thermal pad abutting the outer surface of the shroud and a second side surface of the thermal pad abutting the inner surface of the wall of the heat dissipating structure.

In another embodiment, an outlet assembly includes a chassis including an opening. The outlet assembly includes an outlet positioned in the opening with a face defining a receptacle facing away from the outlet assembly. The outlet has a plurality of pins extending from a bottom side of the outlet. The outlet assembly includes a heat dissipating structure extending from the chassis in a direction toward the plurality of pins past the bottom side of the outlet. The heat dissipating structure includes a wall with an inner surface facing an outer surface of at least one pin of the plurality of pins. The outlet assembly includes a thermal pad positioned between the at least one pin and the wall.

In yet another embodiment, an outlet assembly includes an outlet having a pin extending from a bottom side of the outlet. The outlet assembly includes a heat dissipating structure having a wall with an inner surface facing an outer surface of the pin, and a thermal pad positioned between the pin and the wall. The heat dissipating structure applies a force to the thermal pad that presses the thermal pad toward the pin.

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

DETAILED DESCRIPTION

PDUs distribute electric power to devices in a variety of environments and for a variety of applications. For example, features of PDUs are described in U.S. patent application Ser. No. 15/884,832, "Power Distribution Unit With Interior Busbars," and U.S. patent application Ser. No. 15/884,930, "Breaker Measurement Structure For Power Distribution Unit," both of which were filed on Jan. 31, 2018, and both of which are incorporated herein by reference in their entireties.

In data centers and other industrial environments, a power source is typically provided to information technology ("IT") equipment with a three-phase busway that carries current. Each phase can be provided separately to different types of IT equipment. In some instances, the three-phase busway provides power to a rack that holds electrical equipment such as servers. The IT equipment located in the rack receives power from the busway via a PDU mounted to the rack frame. The PDU includes a connection to the three-phase busway, and a plurality of components to provide, regulate, and monitor the current being distributed to the IT equipment in the rack. Some examples of the components used in such a PDU include outlet modules, communications modules, circuit breakers, and sensors. Although a PDU providing power to IT equipment in a data center is described, the present disclosure is not so limited. One or more features of the disclosed PDU can be provided, either alone or in combination, to define a PDU for distributing power to devices in a wide variety of applications.

Figure 1:
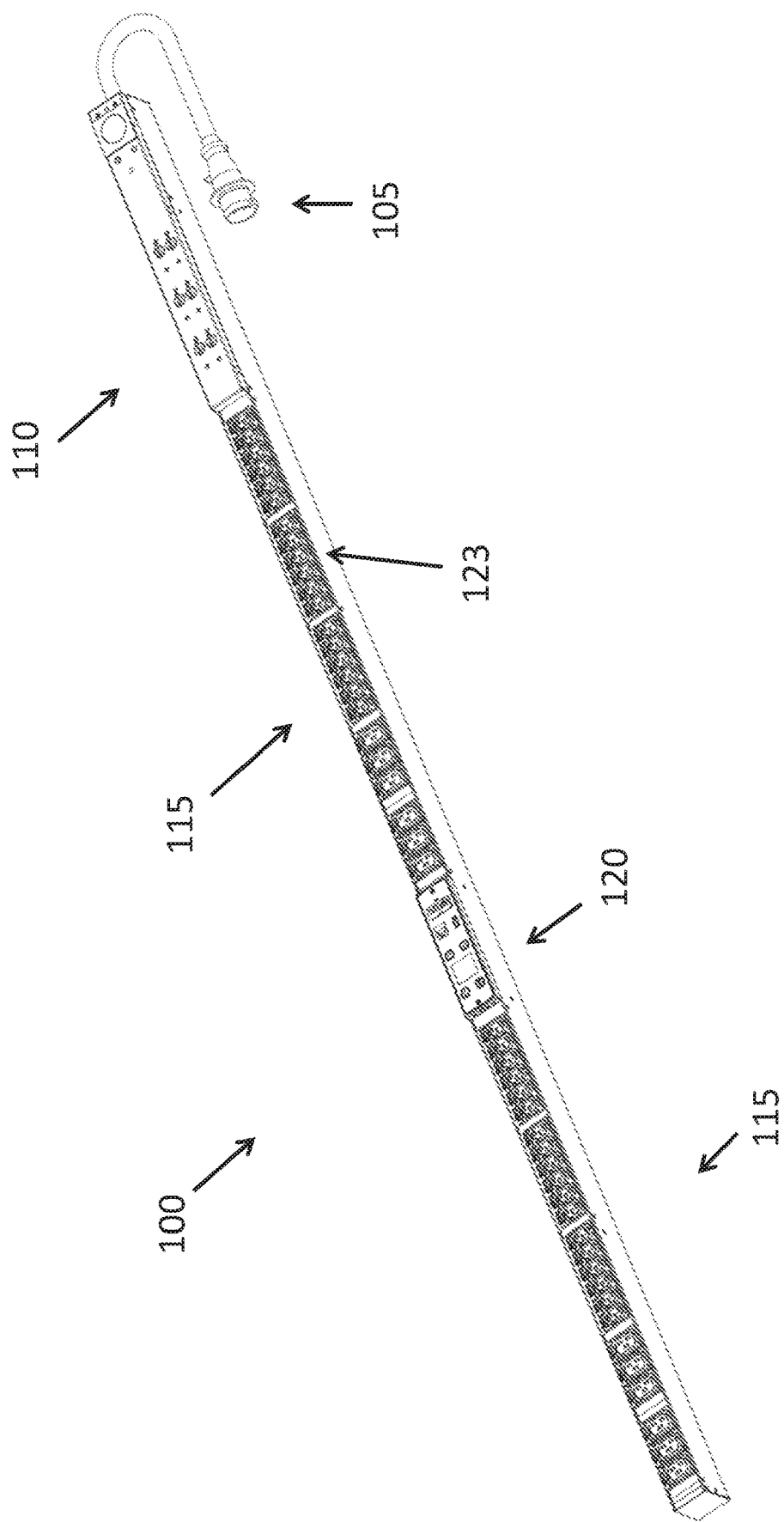
FIG. 1 is a perspective view of a PDU according to one embodiment of the present disclosure.

FIG. 1 is a perspective view of an exemplary PDU 100 that includes an electrical connector 105, an input module 110, outlet modules 115, a communications module 120 located between the two outlet modules 115, and a housing 123. The PDU 100 is configured to be mounted in a rack frame (not shown), and to provide power to equipment located in the rack. The rack may house IT equipment, such as servers, data storage, and other similar equipment. PDU 100 includes mounting features (not shown) that are used to fix PDU 100 to a rack frame. Exemplary mounting features include, without limitation, mechanical fasteners, locking mechanisms, protruding pins and corresponding slots, etc. (not shown).

Electrical connector 105 is configured to be connected to an outlet of a three-phase power source to provide power to the input module 110. The electrical connector 105 can be provided as a plug (as shown) that connects to a power source by a removable connection or by hardwiring or other electrical connection between the electrical connector 105 and a power source. Input module 110 in turn distributes the power to the outlet modules 115 and communications module 120. Plug 105 is configured to draw current from the three-phase current source outlet. The input module 110 can include circuit protection devices (not shown), that may include, without limitation, circuit breakers, fuses, residual-current devices, reclosers, polyswitches, and any combination of these and other protection devices. The current received from plug 105 first passes through a circuit protection device before being distributed to the outlet modules 115 or communications module 120.

Outlet modules 115 provide power to equipment mounted in the rack, through the equipment plugs. Communications module 120 provides information related to PDU performance or operating characteristics. Examples of performance or operating characteristics include, without limitation, voltage, current, frequency, power, and energy. The communications module 120 can provide this information to a user using a variety of communications technologies, such as wireless internet (or intranet) transmitters, Bluetooth, a physical display, indicator lights etc.

Figure 2:
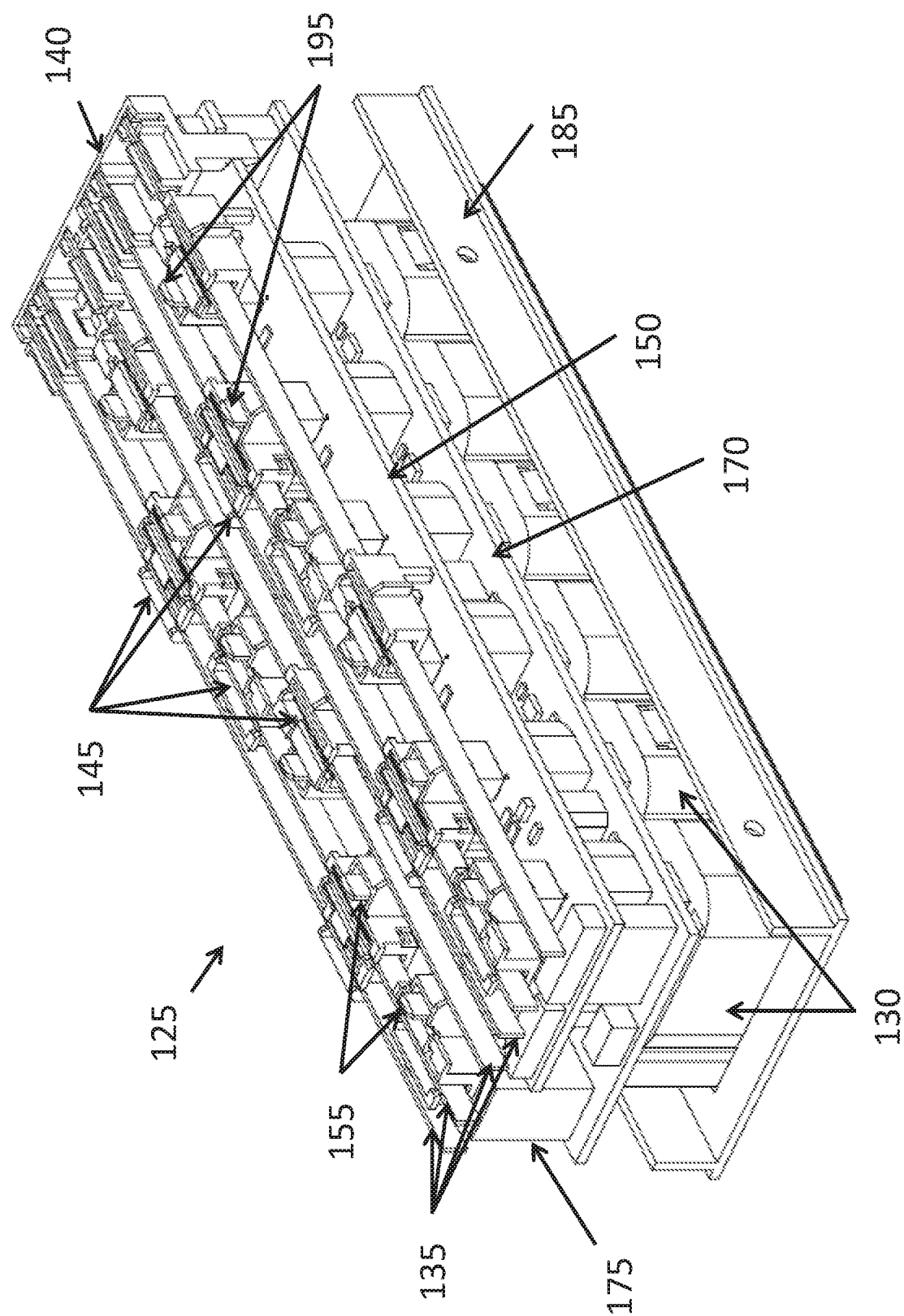
FIG. 2 is a perspective view of an exemplary embodiment of an outlet module section of the PDU according to the embodiment of FIG. 1.

FIG. 2 shows a perspective view of a section 125 of one outlet module 115, with the outlets 130 facing downwards and the housing 123 removed for clarity. The components of outlet module section 125 are more easily seen in FIG. 3, which depicts an exploded drawing of outlet module section 125 from the same perspective as in FIG. 2. FIG. 4 shows the perspective view of the section 125 of FIG. 2, with some additional features removed for clarity. The outlet module section 125 in this embodiment has six outlets 130, although a lesser or greater number of outlets 130 can be provided in alternative embodiments. Each outlet 130 includes an outlet pin 195 extending in a direction opposite the outlet face. The components and functioning of each outlet module section 125 may be similar, so only outlet module section 125 is shown.

Figure 3:
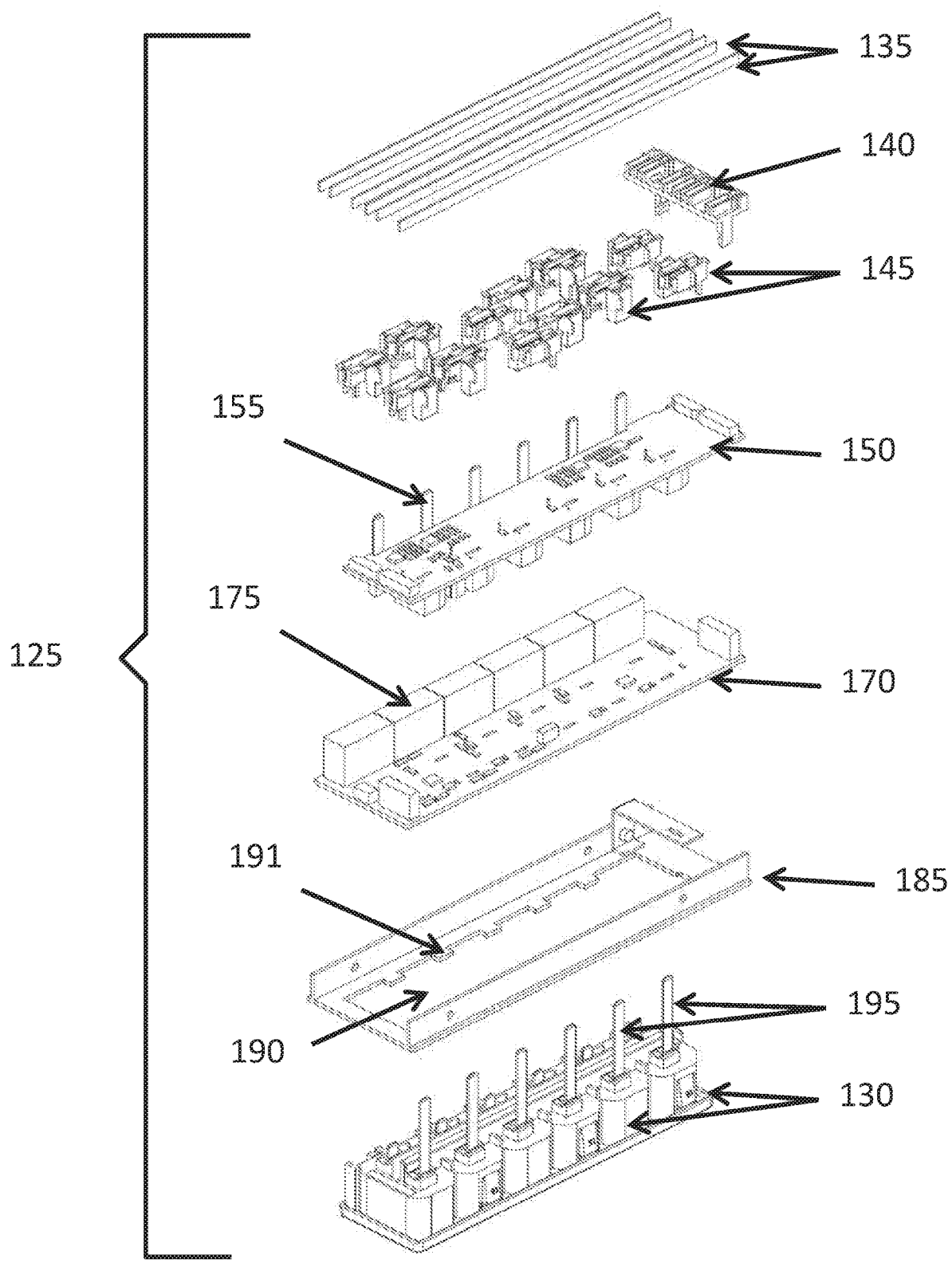
FIG. 3 is an exploded view of the outlet module section of FIG. 2.
Figure 4:
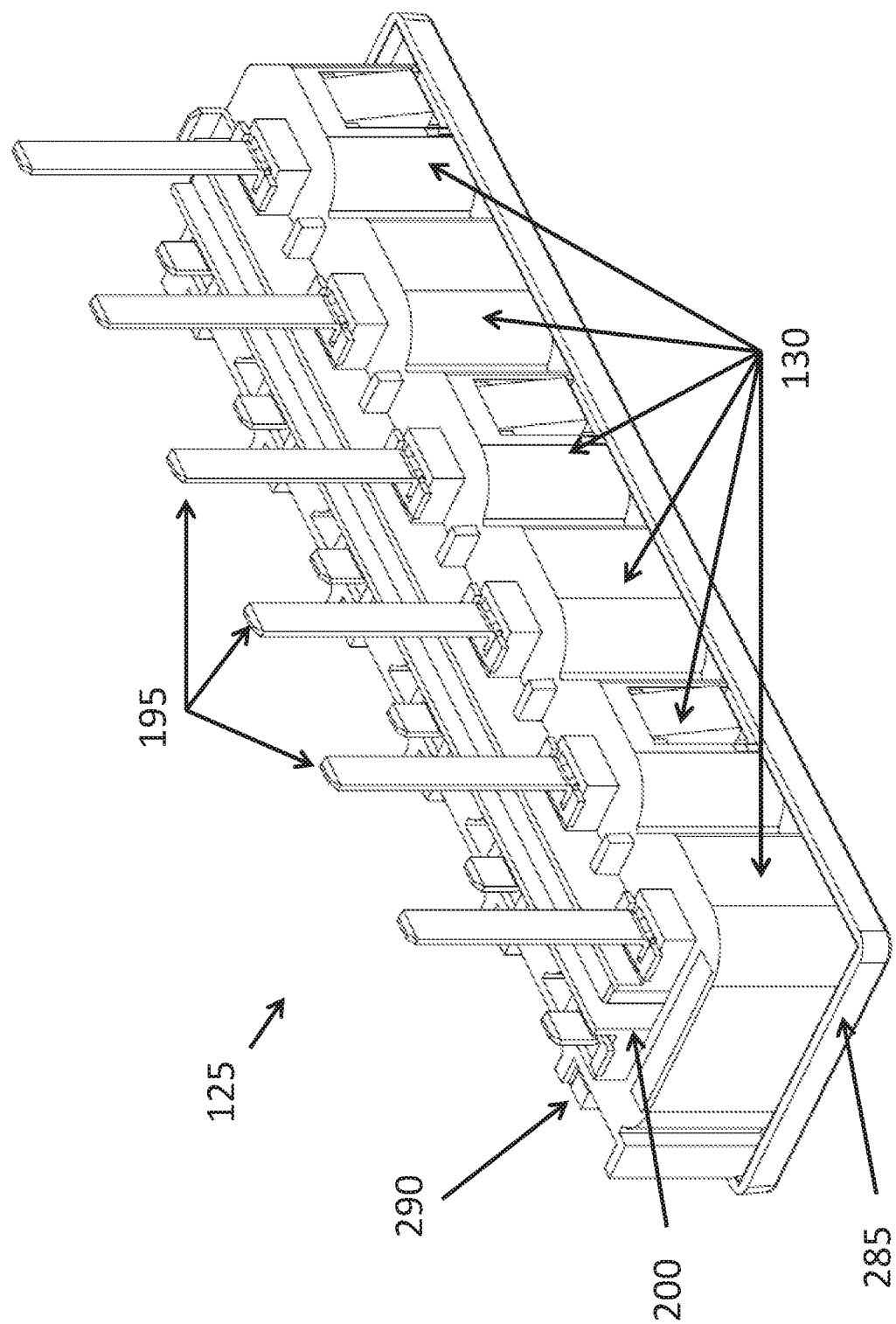
FIG. 4 is the view of the outlet module section of FIG. 2 with some features removed for clarity.

Referring to FIG. 2 and FIG. 3, a set of busbars 135 runs the length of the entire outlet module 115 and delivers current to the outlets 130 in each outlet module section 125. A busbar cap 140 receives the busbars 135 and maintains the distance between each busbar. Busbars 135 are made from a conductive material, such as phosphor bronze, copper, or an alloy. Each of the busbars 135 is connected via wiring to one of three circuit protection devices (not shown) in the input module 110. Each circuit protection device receives power from one of the three current phases received by the plug 105 from an external source. Three of the busbars 135, carry input current corresponding to their respective phases. The other three busbars 135 are neutral lines (electrically connected to either a different phase or an actual neutral) that each complete a circuit with the respective busbars carrying the input current. In an alternative embodiment (not shown) wires are employed instead of busbars.

Chassis 185 is a one-piece frame that extends the length of the outlet module 115 and receives each outlet module section 125. Chassis 185 is made from a metal, such as aluminum or an aluminum alloy. A single chassis 185 includes a plurality of openings 190 (shown in FIG. 3) each opening sized to receive outlets 130 of an outlet module section 125 in a snap-fit type interface. As shown in FIG. 4, multiple outlets 130 are disposed in one molded plastic assembly that includes an integrated busbar 200 for grounding all of the outlets 130. Grounding path provides grounding for equipment plugged into each outlet 130. In alternative embodiments (not shown), an individual outlet is disposed in each assembly and may not include ground busbar 200. Outlets 130 are also attached to outlet faceplate 285. Outlets 130 can be fixed to faceplate 285 via a snap-fit type connection, through use of an adhesive, or with mechanical fasteners. Outlets 130 further include indentations 290 that align with protrusions 191 (shown in FIG. 3) of chassis openings 190, to provide an aligned and secure connection therewith.

The outlet module section 125 can include one or more additional components for distributing electric power. For example, as illustrated in FIG. 2 and FIG. 3, printed circuit board assembly ("PCBA") 150 can include one or more microprocessors that communicate with communications module 120 and relay board 170, other logic elements, and/or a microcontroller. PCBA includes a number of pins 155 that correspond to the number of outlets 130 in the outlet module section 125. Relay board 170 includes relays 175, light emitting diodes ("LEDs"), and communication ports. Each outlet 130 is further electrically connected to a relay 175 via mating electrical conductor elements located on relay 175 and outlet 130, so that outlets 130 receive current through relays 175.

Jumpers 145 connect the busbars 135 to the appropriate pins 155 of PCBA 150, which are electrically connected to outlets 130. Jumpers 145 are further connected to the pins 195 of outlets 130. In other alternative embodiments (not shown), jumpers 145 could be soldered to busbars 135 and pins 155, 195, or jumpers 145 could be connected via any other permanent connection means. When a user plugs equipment in to the outlet 130, the circuit including the circuit protection device, busbars 135, outlet 130, and user equipment is closed, thereby providing power to the user equipment.

Figure 5:
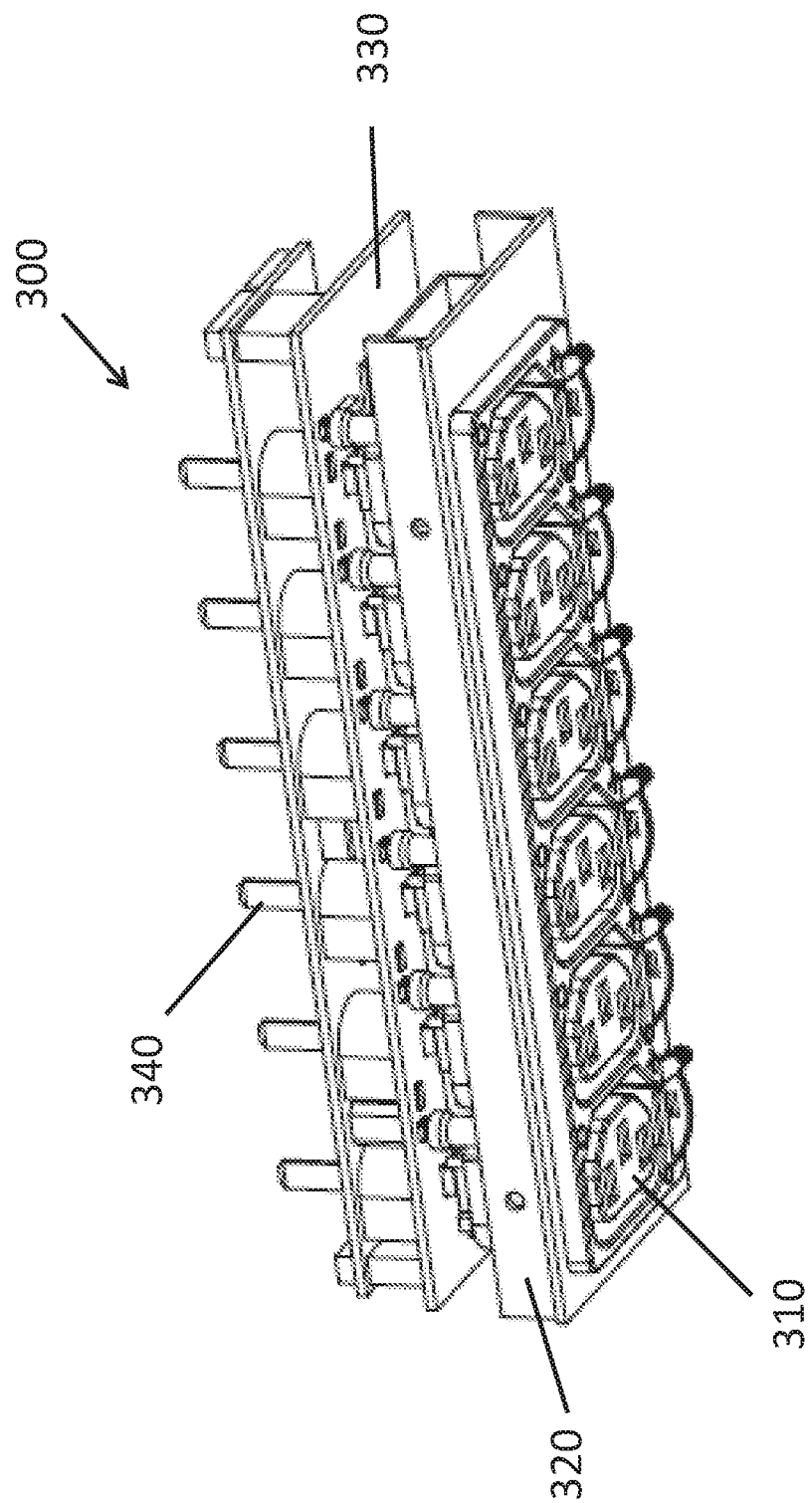
FIG. 5 is a bottom perspective view of another exemplary embodiment of an outlet module section of a PDU.
Figure 6:
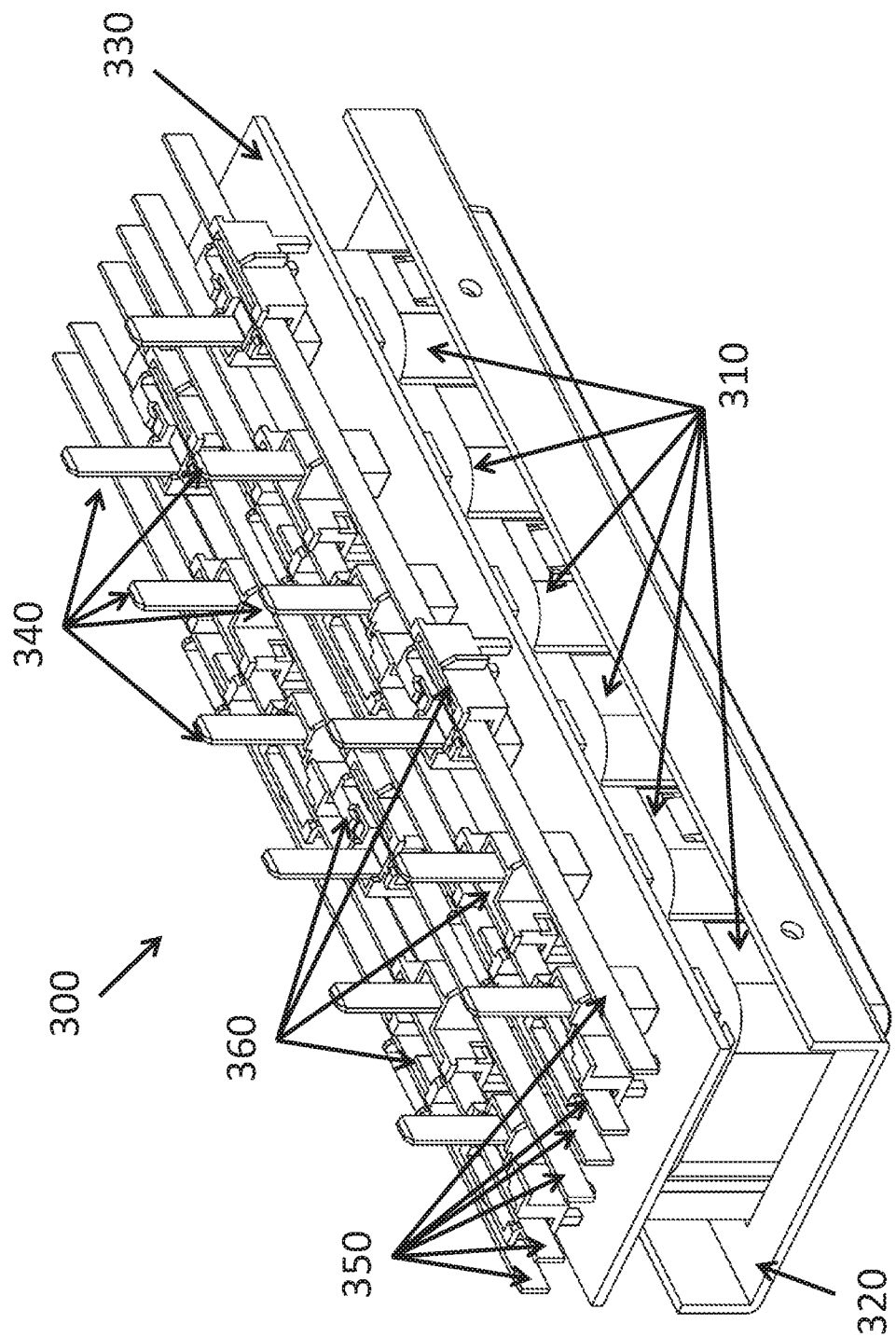
FIG. 6 is a top perspective view of the outlet module section of FIG. 5.
Figure 7:
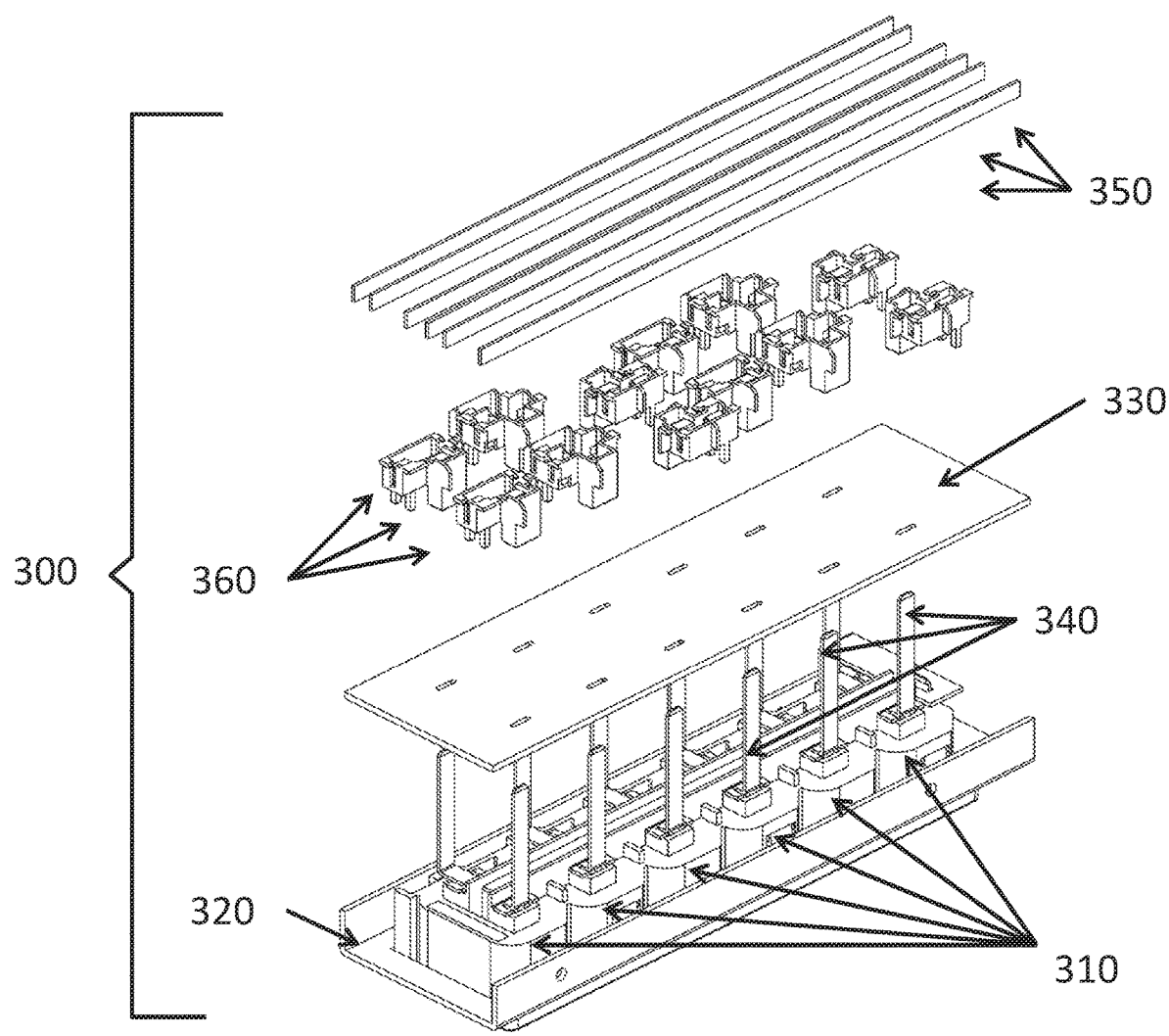
FIG. 7 is an exploded view of the outlet module section of FIG. 6.
Figure 8:
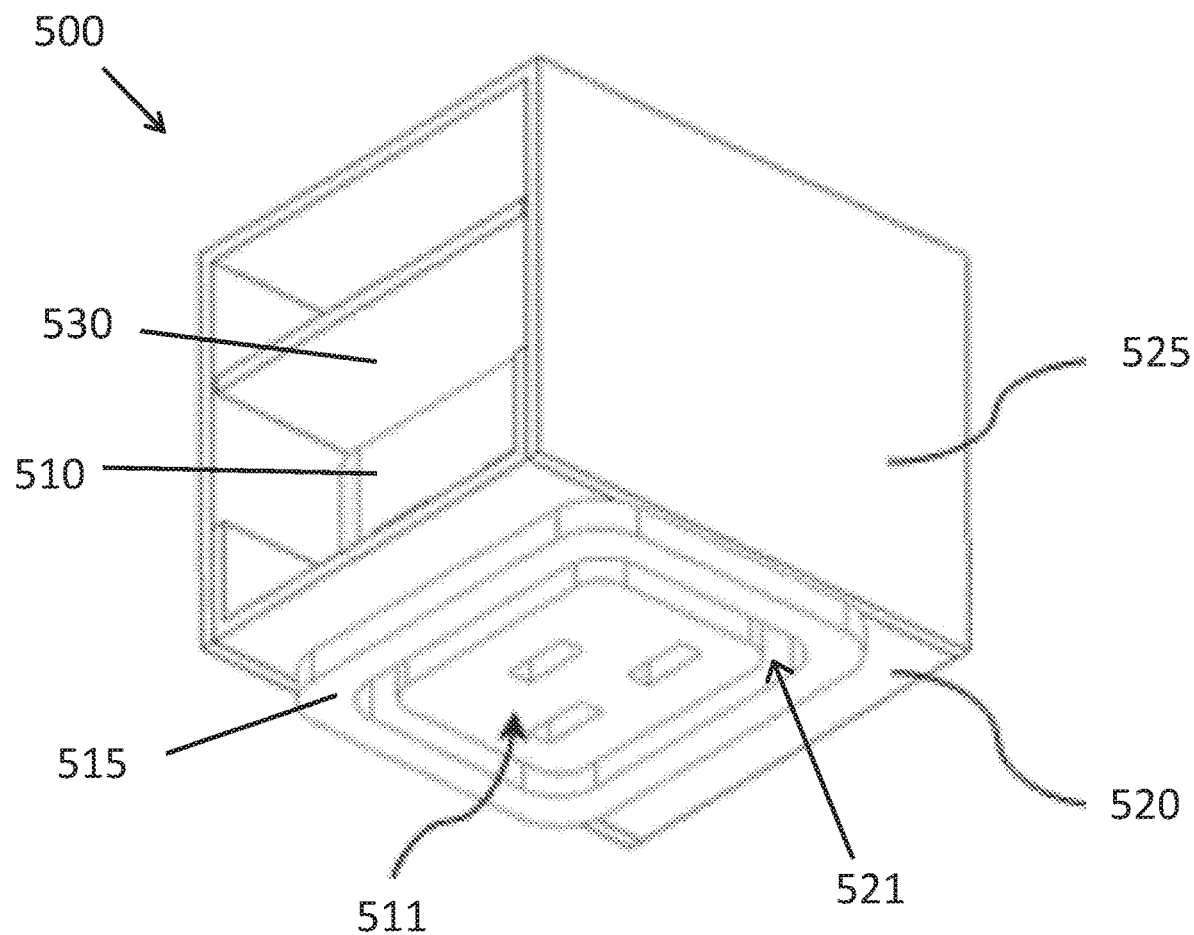
FIG. 8 is a bottom perspective view of an exemplary outlet assembly of an outlet module for a PDU.

FIGS. 5-7 illustrate another embodiment of an outlet module section 300 that omits a PCBA and relay board. Outlet module section 300 in this embodiment is part of a simple PDU that does not include outlet switching or outlet metering, and may or may not include a communications module. The outlet module section 300 includes a plurality of outlets 310 fixed to a chassis 320, and further includes a flat insulator sheet 330 resting on one side of outlets 310. The flat insulator sheet 330 prevents short circuits.

As shown in FIG. 6, each outlet 310 further includes two-outlet pins 340 extending from a back side of each outlet 310. In this embodiment, the outlet module section 300 does not include relays, so the outlet pins 340 complete a circuit with busbars 350. For example, busbars 350 provide power to the outlet module section 300 and jumpers 360 connect the busbars 350 to the outlet pins 340.

FIG. 7 shows the outlet module section 300 in an exploded view. Flat insulator sheet 330 separates the outlet pins 340 from each other, and provides an insulating layer between the current-carrying busbars 350 and the outlets 310. Flat insulator sheet 330 includes a plurality of slots sized and shaped to receive outlet pins 340, and to permit an electrical connection between the outlets 310 and busbars 350 via outlet pins 340 only. The flat insulator sheet 330 thereby prevents any accidental contact between conductive elements to prevent short-circuiting. In alternative embodiments (not shown), the flat insulator sheet 330 can be omitted, or a plurality of insulator sheets can be included instead of a single flat insulator sheet.

Regardless of the specific configuration of various components, when an electrical current flows through the outlet module section 125, 300 of the outlet module 115 of the PDU 100, certain components may experience an increase in temperature. For example, when an electrical current flows through the electrically conductive pins 195, 340 of the outlet 130, 310, the temperature of the pins 195, 340 increases based on the electrical resistance of the pins 195, 340 and the heating effect of the electrical current. Increased temperatures can create safety and operability problems for the PDU 100. For example, safety codes may define a temperature below which components within the PDU 100 must be during operation. Additionally, increased temperatures can melt plastic components, and degrade the strength or other material characteristics of various metal or plastic components. Some PDUs that obtain a temperature during operation greater than a predetermined temperature may be identified as unsafe and unusable and may not function for their intended purpose.

Accordingly, to decrease or maintain a temperature of the PDU 100 below the predetermined temperature, structures to dissipate heat within the PDU 100 are desirable. For example, a heat dissipating structure provides the ability for relatively hotter components within the PDU 100 (e.g., pins 195, 340) to transfer heat to relatively cooler components (e.g., chassis 185, 320) or housing 123. Heat dissipating structures for PDUs thus increase operational safety of the PDU 100, prolong the lifetime of components within the PDU 100, and provide a reliable efficient system for distributing electric power.

Figure 9:
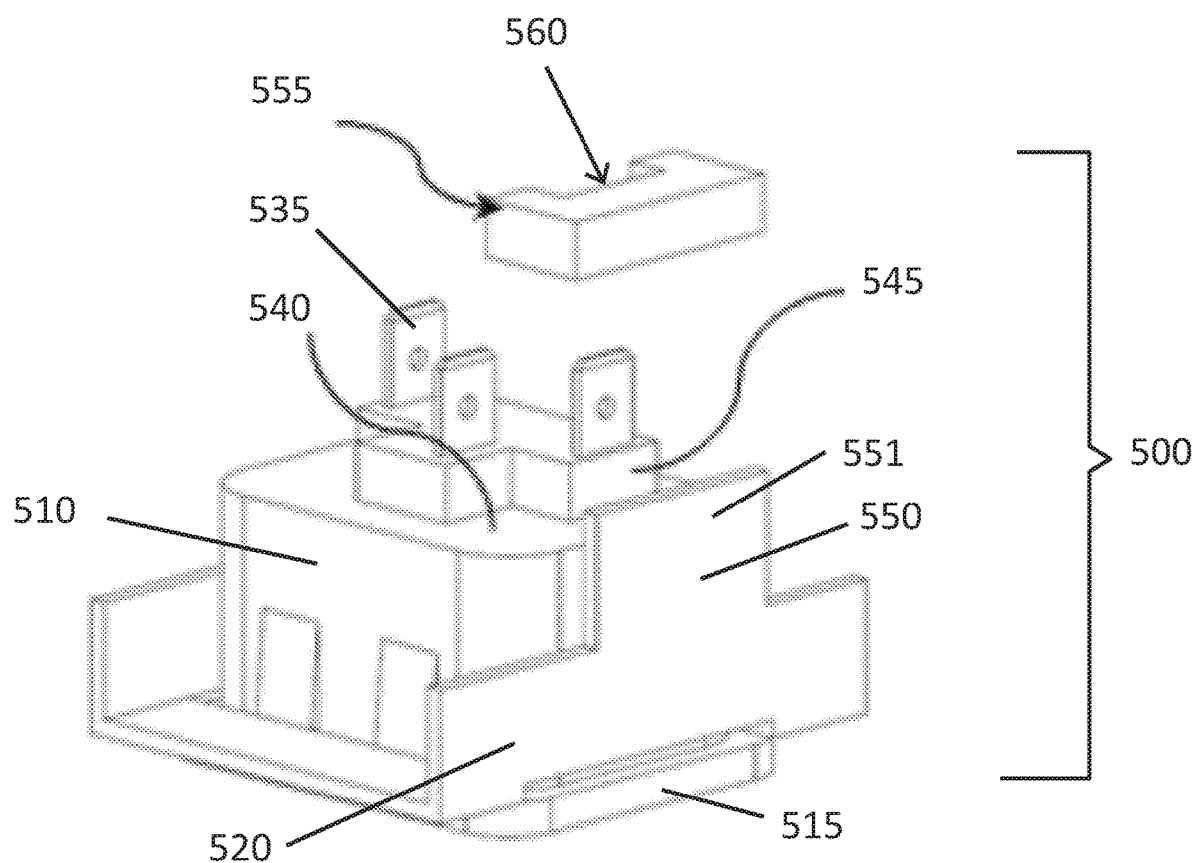
FIG. 9 is a top, partially exploded perspective view of an exemplary embodiment of the outlet assembly of FIG. 8 including a heat dissipating structure and a thermal pad.
Figure 10:
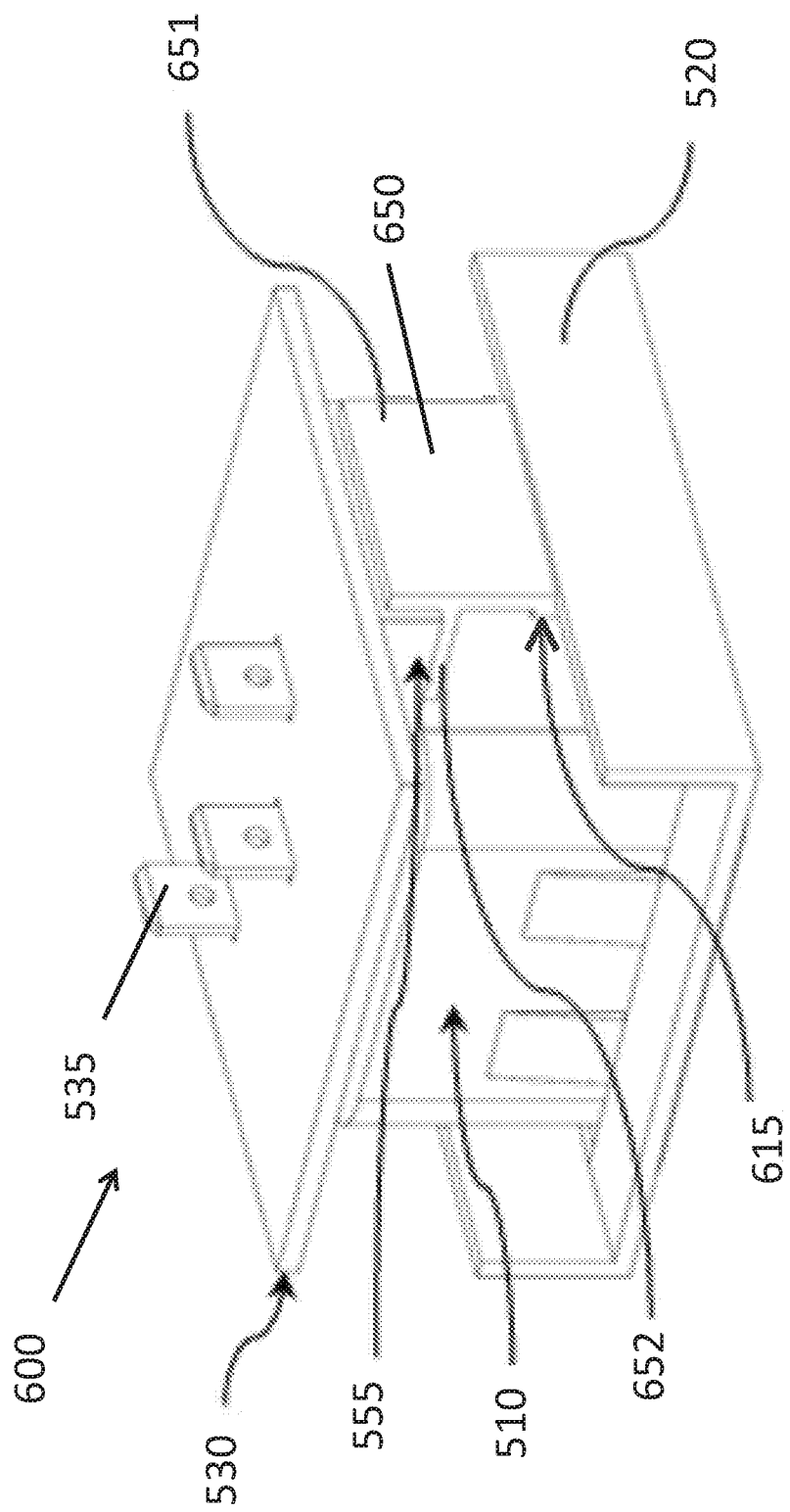
FIG. 10 is a top perspective view of another exemplary embodiment of an outlet assembly including a board, a heat dissipating structure, and a thermal pad.
Figure 11:
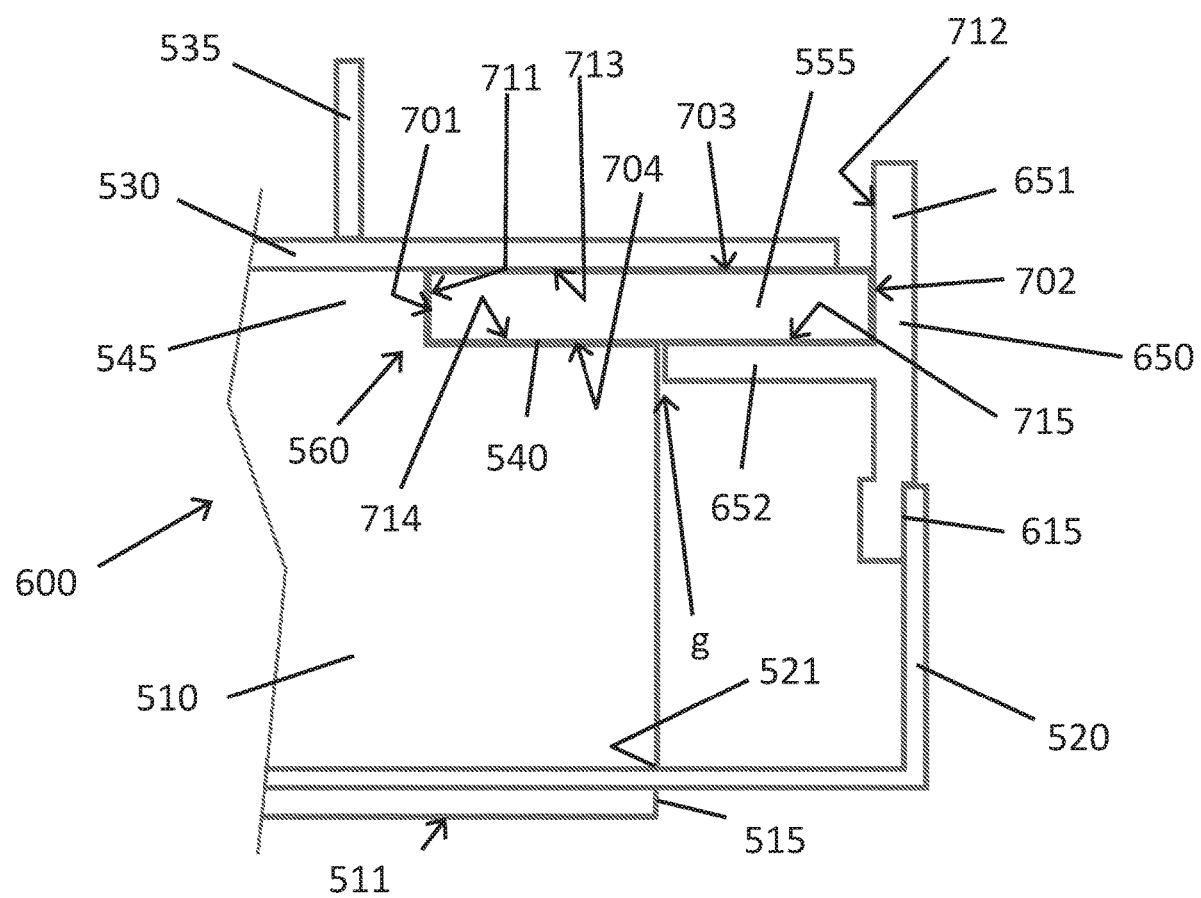
FIG. 11 is a partial front side view of the outlet assembly of FIG. 10.

FIGS. 8-11 provide exemplary embodiments of a first exemplary heat dissipating structure 550 (shown in FIG. 9) and a second exemplary heat dissipating structure 650 (shown in FIG. 10 and FIG. 11). The heat dissipating structure 550, 650 is provided to dissipate heat within a PDU 100. Heat dissipating structure 550 is described with reference to a schematic representation of an outlet assembly 500, and heat dissipating structure 650 is described with reference to a schematic representation of an outlet assembly 600. Outlet assembly 500, 600 is configured to function with an outlet module section 125, 300 of an outlet module 115 of a PDU 100. For example, outlet assembly 500, 600 can include one or more features of the PDU 100 discussed above. Thus, the outlet assembly 500, 600 should not be interpreted as limiting the applicability of the present disclosure, as the heat dissipating structure 550, 650 finds utility in a variety of applications with a variety of components for dissipating heat from outlets 130, 310 of a PDU 100.

The outlet assembly 500, 600 includes outlet 510, faceplate 515, chassis 520, and housing 525. The chassis 520 includes an opening 521 providing access to the outlet 510. The outlet 510 can be positioned in the opening 521 with a face 511 defining a receptacle facing away from the outlet assembly 500, 600 to provide a user access to the receptacle. Additionally, in some embodiments, the outlet assembly 500, 600 can include a board 530. The board 530 may be a sheet, a panel, an instrument panel, a PCBA, a relay board, an insulating sheet, or a structure having a thin profile with a flat surface manufactured from a relatively stiff material.

As shown in FIG. 9 (with the housing 525 removed for clarity), the outlet 510 includes pins 535 extending from a bottom side 540 of the outlet 510. The pins 535 are partially enclosed within a shroud 545 protruding from the bottom side 540 of the outlet 510. As discussed above, one or more of the pins 535 electrically connects to an electrical current. As the current flows through the pins 535, one or more pins 535 may increase in temperature, as described above. Under some operating conditions, the pins 535 may attain the highest temperature of any component of the outlet 510, due to the flow of current. Features that are spatially located or positioned adjacent (e.g., in contact with or in close proximity to) the pins 535 can also increase in temperature based on conduction of the heat from the pins 535 to, for example, the shroud 545, the bottom side 540 of the outlet 510, the board 530, and the outlet 510 generally. The transfer of heat to these components is limited by the material properties of the components, which can be poor conductors of heat. Thus, heat can accumulate and build up (e.g., continually increase) on the pins 535 during operation of the outlet 510. As described above, the concentration of increased temperatures can create safety and operability problems for the PDU 100.

As further shown in FIG. 9, the outlet assembly 500 includes heat dissipating structure 550 and a thermal pad 555. The thermal pad 555 and the heat dissipating structure 550 dissipate heat (e.g., increase the amount and rate of heat transfer) from the one or more pins 535 (or the components spatially adjacent to the pins 535) to comparatively cooler components via conduction, or to the environment based on convection or radiation. The thermal pad 555 is a thermally conductive pad (e.g., thermal gap pad) that is rated for a particular rate of heat transfer. The specific thermal conductivity properties of the thermal pad 555 can be selected based on the operating conditions of the outlet assembly 500 including, but not limited to, the level of current flowing through the pins 535, the length of time the current is expected to flow, the ambient temperature of the environment in which the outlet assembly 500 may be employed, particular safety standards and codes, and customer specifications. In some embodiments, the thermal conductivity of the thermal pad 555 can range from about 1.0 W/mK to about 10.0 W/mK, such as about 6.0 W/mK. The thermal pad 555 can be manufactured from silicone, or a filler material that provides thermal conductivity greater than the thermal conductivity of air. Thus, by providing the thermal pad 555, the rate of heat transfer is increased.

The shape of the thermal pad 555 may be defined by the shroud 545 of the outlet 510. For example, the thermal pad 555 can be manufactured, cut, formed, or otherwise fashioned to include a predetermined shape 560 corresponding to a profile of the shroud 545. Providing the thermal pad 555 with a predetermined shape 560 corresponding to a profile of the shroud 545 can increase heat transfer to the thermal pad 555 from the pins 535 and the shroud 545 based on increased surface area contact between the corresponding profile of the shroud 545 and the mating predetermined shape 560 of the thermal pad 555.

In the illustrated embodiment, the predetermined shape 560 of the thermal pad 555 includes a recess and protrusions defining a rectangular cut-out portion configured to abut one or more walls of the shroud 545. In other words, the thermal pad 555 is substantially C-shaped. In other embodiments, the predetermined shape 560 may be a linear profile, an oval or circular profile, a polygonal profile, a curved or non-linear profile, or other shaped-profile corresponding to a structural profile of the shroud 545, where the thermal pad 555 is configured to be positioned to abut (e.g., contact) the shroud 545. The thermal pad 555 is shown in an unassembled, partially exploded, state in FIG. 9. When assembled, the thermal pad 555 is held in place by the board 530 (shown in FIG. 8), such that the thermal pad abuts the shroud 545 and a wall portion 551 of heat dissipating structure 550.

In the illustrated embodiment, the wall 551 of the heat dissipating structure 550 is an integrally formed extension of the chassis 520. The chassis 520 includes a vertical extension defining the wall 551 of the heat dissipating structure 550. When provided as an integral feature with the chassis 520, the heat dissipating structure 550 and the chassis 520 are manufactured from the same material (e.g., steel, aluminum, brass). The heat dissipating structure 550 and the chassis 520 can be manufactured from other materials selected based on one or more of cost of the material, strength of the material, thermal conductivity of the material, or other characteristics.

The heat dissipating structure 550 provides both a structural function by securing the thermal pad 555 against the shroud 545 and a heat transfer function by dissipating heat from the thermal pad 555. Based on conduction heat transfer, heat from the pins 535 transfers from the pins 535 to the shroud 545, from the shroud 545 to the thermal pad 555, from the thermal pad 555 to the heat dissipating structure 550, and from the heat dissipating structure 550 to the chassis 520. Heat can further transfer from the chassis 520 to the housing 525 (shown in FIG. 8) and to the environment. The thermal pad 555 and the heat dissipating structure 550 dissipate heat from the pins 535 to reduce or maintain a temperature of the pins 535, thereby preventing or reduce an increase in temperature of the pins 535. The reduced or maintained temperature of the pins 535 can define a safe and efficient operating temperature of the outlet 510 and of the PDU 100 in which the outlet 510 is incorporated.

FIG. 10 illustrates a top perspective view of outlet assembly 600. Additionally, FIG. 11 is a partial front side view of the outlet assembly 600. The outlet assembly 600 is substantially the same as the outlet assembly 500 shown in FIGS. 8-9, except for the differences discussed herein. Like reference numerals are used for like components. In the illustrated embodiment, the heat dissipating structure 650 is a separate piece that connects to the chassis 520 at interface 615 with the wall 651 of the heat dissipating structure 650 extending from the interface 615. When provided as a separate structure, the heat dissipating structure 650 and the chassis 520 can be manufactured from the same material (e.g., steel/steel, aluminum/aluminum, brass/brass) or from different materials (e.g., steel/aluminum, steel/brass, aluminum/steel, aluminum/brass, brass/steel, brass/aluminum). The particular materials listed are exemplary and not intended to be limiting.

As shown in FIG. 10, when assembled, the thermal pad 555 is positioned adjacent to and in abutting relationship with the shroud 545. The thermal pad 555 is held in place with the wall portion 651 of the heat dissipating structure 650. As shown in FIG. 11, an inner surface 712 of the wall 651 of the heat dissipating structure 650 faces the shroud 545. With the thermal pad 555 positioned between the shroud 545 and the wall 651, the wall 651 applies a force on the thermal pad 555 to maintain the thermal pad 555 in contact with the shroud 545. By applying a force to hold the thermal pad 555 against the shroud 545, the surface area of the thermal pad 555 in contact with the outer surface of the shroud 545 can increase (or be most efficiently provided) as compared to a thermal pad placed in position near the shroud without a force applied.

Additionally, when providing the heat dissipating structure 650 as a separate piece, the construction of the heat dissipating structure 650 can benefit from greater design flexibility that may otherwise be limited by the manufacturing limitations of an integral chassis 520 and heat dissipating structure 550. For example, the heat dissipating structure 650 includes a flange 652 extending from the wall 651 on which a portion of the thermal pad 555 is positioned. In alternative embodiments, an integral chassis 520 and heat dissipating structure 550 can also include a flange feature, even if the manufacturing of such a flange in an integral component may be more challenging. Thus, whether the heat dissipating structure 550, 650 is respectively formed as an integral part of the chassis 520 or as a separate piece connected to the chassis 520 at interface 615, the flange 652 is an optional feature of the heat dissipating structure 550, 650. In the illustrated embodiment, the flange 652 supports the thermal pad 555 to increase the ability of the heat dissipating structure 650 to apply a force on the thermal pad 555 and hold or maintain the thermal pad 555 in contact with the shroud 545.

Although FIG. 11 shows a single pin 535 and a portion of the shroud 545, the thermal pad 555 can laterally circumscribe the shroud 545, either partially or entirely, in other embodiments to dissipate heat from any one or more pins 535. Similarly, the thermal pad 555 can be provided as a single piece having a predetermined shape 560 corresponding to a profile of the shroud 545 formed therein. Alternatively, the thermal pad 555 can be provided as a plurality of pieces that are assembled to define the predetermined shape 560 corresponding to a profile of the shroud 545, where the plurality of pieces laterally circumscribe the shroud 545, either partially or entirely.

The thermal pad 555 includes a first side surface 701 facing and abutting an outer surface 711 of the shroud 545 and a second side surface 702 facing and abutting inner surface 712 of wall 651 of the heat dissipating structure 650. The first side surface 701 is opposite the second side surface 702 with lateral surfaces of the thermal pad 555 extending between the side surfaces 701, 702. For example, the thermal pad 555 includes a first lateral surface 703 facing and abutting an underneath surface 713 of the board 530 and a second lateral surface 704 facing and abutting an outer surface 714 of the bottom side 540 of the outlet 510. When the heat dissipating structure 650 includes a flange 652, the fourth lateral surface 704 also faces and abuts an inner lateral surface 715 of the flange 652. The inner lateral surface 715 of the flange 652 meets the inner surface 712 of the wall 651. In the illustrated embodiment, the inner lateral surface 715 and the inner surface 712 meet at a right angle, although other angles can be provided.

Relative to the face 511, the wall 651 of the heat dissipating structure 650 extends away from the face 511, defining a receptacle for receiving an electrical plug, in a direction toward the pins 535. The wall 651 can extend past one or more of the bottom side 540 of the outlet 510, past the board 530, or past the shroud 545. In some embodiments, the wall 651 extends past one or more of the bottom side 540 of the outlet 510, past the board 530, or past the shroud 545 and terminates prior to (e.g., short of) extending past an outermost end of the pins 535. Thus, the wall 651 is positioned and structured to hold the thermal pad 555 relative to the outlet 510 with the predetermined shape 560 abutting the shroud 545.

The flange 652 extends from the surface 712 of the wall 651 toward the outlet 510. In some embodiments, the inner surface 715 can be coplanar with the surface 714 of the bottom side 540 of the outlet 510, although the inner surface 715 can be offset relative to (e.g., above or below) the surface 714 of the bottom side 540 of the outlet 510. A cantilevered end of the flange 652 can abut the outlet 510 or may be spaced a distance from the outlet defining a gap "g" between the flange 652 and the outlet 510. The thermal pad 555 thus spans the gap "g" from the shroud 545 to the wall 651 of the heat dissipating structure 650.

Figure 12:
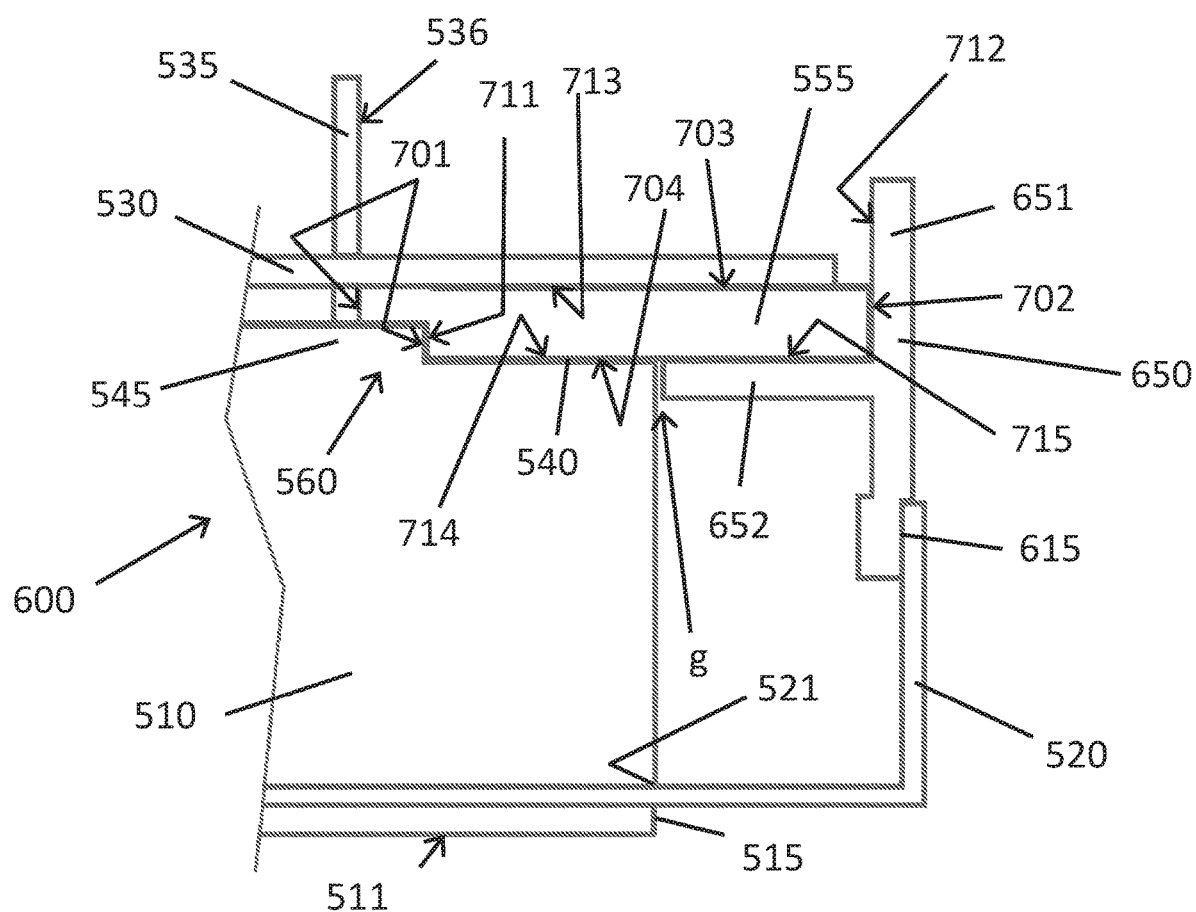
FIG. 12 is an alternate embodiment of the partial front side view of the outlet assembly of FIG. 11.

In an alternate embodiment shown in FIG. 12, the first side surface 701 of the thermal pad 555 faces and abuts the outer surface 711 of the shroud 545 and an outer surface 536 of the pin 535. In another alternate embodiment shown in FIG. 13, the first side surface 701 of the thermal pad 555 faces and abuts the outer surface 536 of the pin 535. For example, in some embodiments, the pin 535 can extend from the bottom side 540 of the outlet 510 without a shroud 545. In either embodiment of FIG. 12 and FIG. 13, the thermal pad 555 can be provided as a single piece having a predetermined shape 560 corresponding to a profile of the shroud 545 or the pin 535 formed therein. Alternatively, the thermal pad 555 can be provided as a plurality of pieces that are assembled to define the predetermined shape 560 corresponding to a profile of the shroud 545 or the pin 535, where the plurality of pieces laterally circumscribe the shroud 545 or the pin 535, either partially or entirely.

Figure 13:
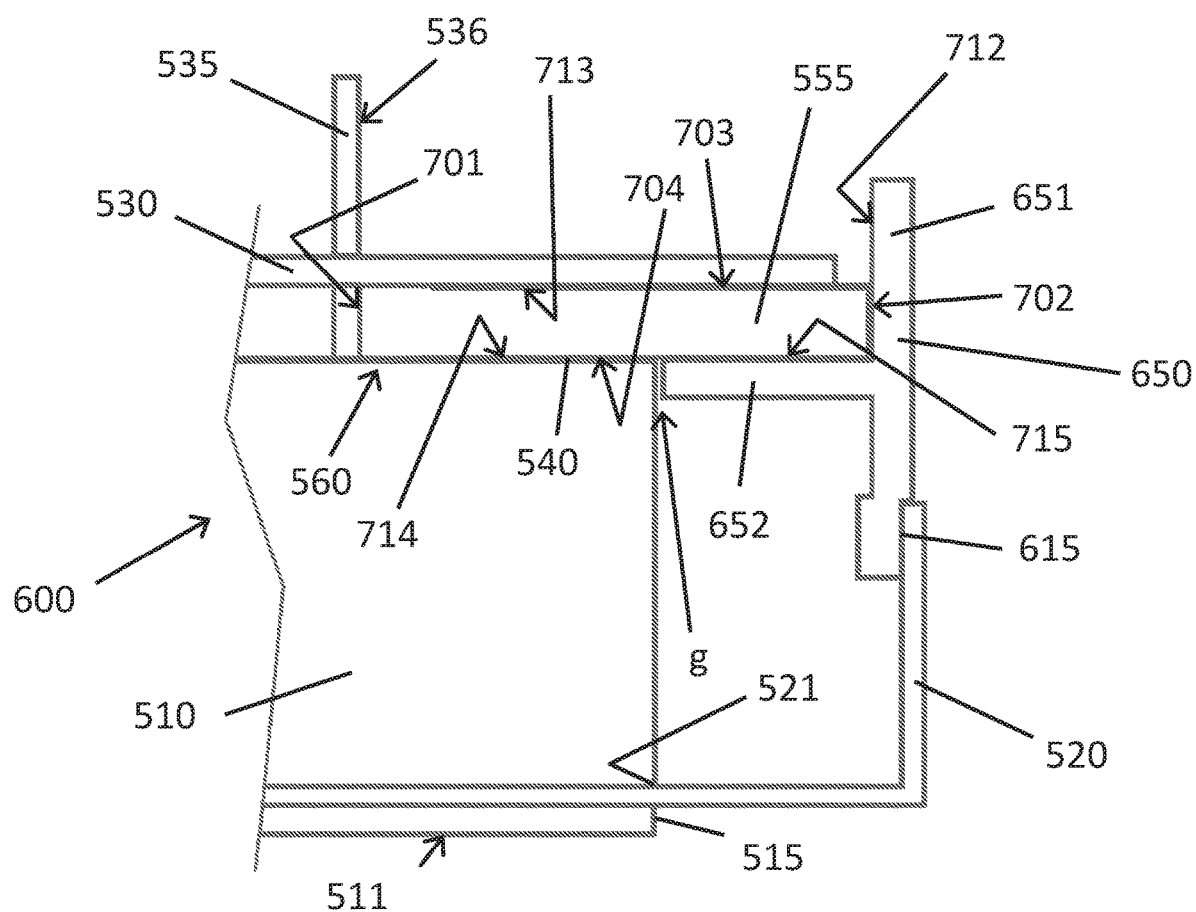
FIG. 13 is another alternate embodiment of the partial front side view of the outlet assembly of FIG. 11.

When assembled, the thermal pad 555 is positioned adjacent to and in abutting relationship with the shroud 545 or the pin 535. The thermal pad 555 is held in place with the wall portion 651 of the heat dissipating structure 650. As shown in FIG. 12 and FIG. 13, the inner surface 712 of the wall 651 of the heat dissipating structure 650 faces the shroud 545 or the pin 535 With the thermal pad 555 positioned between the shroud 545 or the pin 535 and the wall 651, the wall 651 applies a force on the thermal pad 555 that presses the thermal pad 555 toward the shroud 545 or the pin 535. The heat dissipating structure 650 maintains the thermal pad 555 in contact with the shroud 545 or the pin 535. By applying a force to hold the thermal pad 555 against the shroud 545 or the pin 535, the surface area of the thermal pad 555 in contact with the outer surface 711 of the shroud 545 and the outer surface 536 of the pin 535 can increase (or be most efficiently provided) as compared to a thermal pad placed in position near the shroud or the pin without a force applied.

A method of assembling the outlet assembly 600 includes positioning the thermal pad 555 relative to the outlet 510 with the first side surface 701 of the thermal pad 555 facing the outer surface 711 of the shroud 545 or the pin 535 This step can include positioning the predetermined shape 560 of the thermal pad 555 relative to the shroud 545 or the pin 535 with the first side surface 701 of the thermal pad 555 facing the outer surface 711 of the shroud 545 or the outer surface 536 of the pin 535. The method also includes positioning the thermal pad 555 relative to the outlet 510 with the second lateral surface 704 of the thermal pad 555 facing the outer surface 714 of the bottom side 540 of the outlet 510.

When the heat dissipating structure 550 is provided as an integral part of the chassis 520 (as shown in FIG. 9), the method can include positioning the thermal pad 555 relative to the heat dissipating structure 550 with the second side surface 702 of the thermal pad 555 facing the inner surface 712 of the wall 551 of the heat dissipating structure 550. Alternatively, when the heat dissipating structure 650 is provided as a separate component (as shown in FIGS. 10-13), the method can include fastening the heat dissipating structure 650 to the chassis 520 at interface 615. One or more fasteners, adhesives, or material bonding (e.g., weld) can fix the heat dissipating structure 650 to the chassis 520 at interface 615. After fastening the heat dissipating structure 650 to the chassis 520, the method can include positioning the thermal pad 555 relative to the heat dissipating structure 650 with the second side surface 702 of the thermal pad 555 facing the inner surface 712 of the wall 651 of the heat dissipating structure 650.

With reference to the outlet assembly 600 of FIGS. 10-13, in embodiments where the heat dissipating structure 650 includes a flange 652, the method can include positioning the thermal pad 555 relative to the outlet 510 or the heat dissipating structure 650 with the second lateral surface 704 of the thermal pad 555 facing the inner surface 715 of the flange 652. The method of assembling the outlet assembly 600 includes positioning the board 530 with its underneath surface 713 facing the first lateral surface 703 of the thermal pad 555. The board 530 can be fixed in position based on its weight, other components apply a stabilizing force on the board, or with one or more fasteners, adhesives, or material bonding (e.g., weld). For example, in some embodiments, the one or more of the pins 535 can be welded or soldered to the board 530 to maintain the board 530 in position.

With reference to outlet assemblies 500, 600 in addition to positioning the thermal pad 555 with its surfaces 701, 702, 703, 704 facing respective surfaces of other components, any one or more of the steps of the method of assembling the outlet assembly 500, 600 can include positioning the thermal pad 555 relative to the outlet 510 or the heat dissipating structure 550, 650 with one or more of its surfaces 701, 702, 703, 704 abutting respective surfaces of other components. In some embodiments, the thermal pad 555 can be sized and shaped to occupy the exact dimensions of the void defined by the relative placement of the pin 535, the shroud 545, the board 530, and the heat dissipating structure 550, 650.

Alternatively, the thermal pad 555 can be oversized to occupy more than the dimensions of the void defined by the relative placement of the pin 535, the shroud 545, the board 530, and the heat dissipating structure 550, 650. In such embodiments, the thermal pad 555 may be manufactured from a material having resilience. Thus, when the heat dissipating structure 550, 650 and the board 530 are positioned in abutting relationship with the thermal pad 555, the oversized thermal pad 555 undergoes compression to accommodate the size restrictions imposed by the placement of the heat dissipating structure 550, 650 and the board 530. The thermal pad 555 is thus pressed or forced against the shroud 545 or the pin 535 and the bottom side 540 of the outlet 510. The pressing force maintains the surface area of the thermal pad 555 in contact with the shroud 545 or the pin 535 and the bottom side 540 of the outlet 510 and can increase heat transfer between abutting surfaces as compared to an undersized or exact-sized thermal pad 555 that is not pressed against the shroud 545 or the pin 535 or the bottom side 540 of the outlet 510.

With reference to FIG. 11, once assembled and operable (e.g., with current flowing), heat generated at the pin 535 transfers from the pin 535 to the shroud 545, and from the outer surface 711 of the shroud 545 to the first side surface 701 of the thermal pad 555. With reference to FIG. 12, once assembled and operable (e.g., with current flowing), heat generated at the pin 535 transfers from the pin 535 to the shroud 545, and from the outer surface 711 of the shroud 545 or the outer surface 536 of the pin 535 to the first side surface 701 of the thermal pad 555. With reference to FIG. 13, once assembled and operable (e.g., with current flowing), heat generated at the pin 535 transfers from the outer surface 536 of the pin 535 to the first side surface 701 of the thermal pad 555.

The heat then transfers through the thermal pad 555 exiting the second side surface 702 of the thermal pad 555 into the inner surface 712 of the wall 651 of the heat dissipating structure 650. Heat within the heat dissipating structure 650 transfers to the chassis 520. Such pattern of heat transfer thus dissipates heat from the pin 535 to the heat dissipating structure 650 based on conduction through the thermal pad 555. Heat may transfer from the first lateral surface 703 of the thermal pad 555 into the underneath surface 713 of the board 530, and from the second lateral surface 704 of the thermal pad 555 into the outer surface 714 of the bottom side 540 of the outlet 510 or into the inner surface 715 of the flange 652 of heat dissipating structure 650. Alternatively, heat may transfer from the underneath surface 713 of the board 530 into the first lateral surface 703 of the thermal pad 555, and from the outer surface 714 of the bottom side 540 of the outlet 510 into the second lateral surface 704 of the thermal pad 555.

Heat within the thermal pad 555 transfers into the inner surface 715 of the flange 652 of the heat dissipating structure 650 and the inner surface 712 of the wall 651 of the heat dissipating structure 650. The flange 652 or the wall 651 can extend along a portion of the width of the thermal pad 555 or along the entire width of the thermal pad 555. With reference to FIGS. 11-13, the width of the thermal pad 555 extends in a direction into and out of the paper. The larger the surface area (e.g., surfaces 712, 715) in contact with the thermal pad 555, the greater the rate of heat transfer from the thermal pad 555 into the heat dissipating structure 650. Thus, providing the heat dissipating structure 650 with the flange 652 and the wall 651 extending along the entire length of the thermal pad 555 increases heat transfer from the thermal pad 555 into the heat dissipating structure 650 and can thus obtain a cooler temperature pin 535 in a shorter period of time.

The specific description of the path of transfer of heat is exemplary and not intended to be limiting or contradictory to the principles of heat transfer. Thus, in further embodiments, heat can transfer from hot to cold based on conduction heat transfer between abutting surfaces. Irrespective of the particular mode of heat transfer, heat at the pins 535 is reduced to or maintained at a predetermined temperature based on the thermal pad 555 and the heat dissipating structure 550, 650, thus providing a safe and effective outlet assembly 500, 600 for a PDU 100.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present disclosure has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the disclosure, in its broader aspects, is not limited to the specific details, the representative system and method, and illustrative examples shown and described. Accordingly, departures may be made from such details without departing from the spirit or scope of the applicant's general inventive concept.

What is claimed is:

1. A power distribution unit ("PDU") comprising:
    an input module;
    an electrical connector configured to be connected to an outlet of a power source to provide power to the input module;
    an outlet module, wherein the input module is configured to distribute the power from the electrical connector to the outlet module, the outlet module including:
        an outlet assembly including an outlet having a shroud protruding from a bottom side of the outlet and a pin extending from the shroud;
        a heat dissipating structure having a wall with an inner surface facing an outer surface of the shroud, wherein the wall extends away from the bottom side of the outlet and terminates short of an outermost end of the pin; and
        a thermal pad positioned between the shroud and the wall, with a first side surface of the thermal pad abutting the outer surface of the shroud and a second side surface of the thermal pad abutting the inner surface of the wall of the heat dissipating structure.

2. The PDU of claim 1, wherein the heat dissipating structure applies a force to the thermal pad that presses the thermal pad against the shroud.

3. The PDU of claim 1, wherein the outlet assembly includes a board having an underneath surface abutting a lateral surface of the thermal pad.

4. The PDU of claim 1, wherein the heat dissipating structure includes a flange with an inner surface extending from the inner surface of the wall, and wherein the inner surface of the flange abuts a lateral surface of the thermal pad.

5. An outlet assembly comprising:
    a chassis including an opening;
    an outlet positioned in the opening with a face defining a receptacle facing away from the outlet assembly, wherein the outlet has a plurality of pins extending from a bottom side of the outlet;
    a heat dissipating structure extending from the chassis in a direction toward the plurality of pins past the bottom side of the outlet, wherein the heat dissipating structure includes a wall with an inner surface facing an outer surface of at least one pin of the plurality of pins;
    a thermal pad positioned between the at least one pin and the wall; and
    a printed circuit board having an underneath surface abutting a first lateral surface of the thermal pad.

6. The outlet assembly of claim 5, wherein the heat dissipating structure and the chassis define an integral part.

7. The outlet assembly of claim 5, wherein the heat dissipating structure is fastened to the chassis at an interface.

8. The outlet assembly of claim 5, wherein the thermal pad has a first side surface opposite a second side surface, and wherein the first side surface abuts the outer surface of the at least one pin and the second side surface abuts the inner surface of the wall of the heat dissipating structure.

9. The outlet assembly of claim 5, wherein the heat dissipating structure includes a flange having an inner surface extending from the inner surface of the wall, and wherein the inner surface of the flange abuts a second lateral surface of the thermal pad.

10. The outlet assembly of claim 9, wherein the inner surface of the flange extends perpendicular from the inner surface of the wall.

11. The outlet assembly of claim 9, wherein the bottom side of the outlet and the inner surface of the flange are coplanar.

12. The outlet assembly of claim 5, wherein the plurality of pins extend from a shroud protruding from the bottom side of the outlet, wherein the inner surface of the heat dissipating structure faces an outer surface of the shroud, and wherein the thermal pad is positioned between the shroud and the wall.

13. The outlet assembly of claim 12, wherein the thermal pad has a first side surface opposite a second side surface, and wherein the first side surface abuts the outer surface of the shroud and the second side surface abuts the inner surface of the wall of the heat dissipating structure.

14. The outlet assembly of claim 13, wherein the first side surface of the thermal pad has a predetermined shape corresponding to a profile of the shroud.

15. The outlet assembly of claim 12, wherein the thermal pad has a first side surface opposite a second side surface, and wherein the first side surface abuts the outer surface of the shroud and the outer surface of the at least one pin, and the second side surface abuts the inner surface of the wall of the heat dissipating structure.

16. The outlet assembly of claim 15, wherein the first side surface of the thermal pad has a predetermined shape corresponding to a profile of the shroud and the at least one pin.

17. An outlet assembly comprising:
    an outlet having a pin extending from a bottom side of the outlet;
    a heat dissipating structure having a wall with an inner surface facing an outer surface of the pin;
    a thermal pad positioned between the pin and the wall, wherein the heat dissipating structure applies a force to the thermal pad that presses the thermal pad toward the pin; and
    a board having an underneath surface abutting a first lateral surface of the thermal pad, wherein the heat dissipating structure includes a flange having an inner surface extending from the inner surface of the wall, and wherein the inner surface of the flange abuts a second lateral surface of the thermal pad.

18. The outlet assembly of claim 17, wherein the pin extends from a shroud protruding from the bottom side of the outlet, wherein the inner surface of the heat dissipating structure faces an outer surface of the shroud, wherein the thermal pad is positioned between the shroud and the wall, and wherein the heat dissipating structure applies a force to the thermal pad that presses the thermal pad toward the shroud.

19. The outlet assembly of claim 17, wherein the inner surface of the flange abuts a second lateral surface of the thermal pad wherein the wall extends away from the bottom side of the outlet and terminates short of an outermost end of the pin.

20. The outlet assembly of claim 17, wherein at least one of the inner surface of the wall of the heat dissipating structure and the inner surface of the flange of the heat dissipating structure extend along an entire width of the thermal pad.

* * * * *